United States Patent
Hashiba et al.

(10) Patent No.: US 7,099,210 B2
(45) Date of Patent: Aug. 29, 2006

(54) SEMICONDUCTOR MEMORY DEVICE HAVING MEMORY CELLS WITH FLOATING GATES AND MEMORY CELL THRESHOLD VOLTAGE CONTROL METHOD

(75) Inventors: Yoshiaki Hashiba, Fujisawa (JP); Takuya Fujimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 11/054,440

(22) Filed: Feb. 10, 2005

(65) Prior Publication Data
US 2005/0174843 A1 Aug. 11, 2005

(30) Foreign Application Priority Data
Feb. 10, 2004 (JP) ............................. 2004-033491

(51) Int. Cl.
*G11C 7/00* (2006.01)
*G11C 16/04* (2006.01)

(52) U.S. Cl. ................................. 365/200; 365/185.24

(58) Field of Classification Search ..................... None
See application file for complete search history.

(56) References Cited

U.S. PATENT DOCUMENTS

| 5,602,789 A | * | 2/1997 | Endoh et al. | ........... | 365/185.03 |
| 6,894,931 B1 | * | 5/2005 | Yaegashi et al. | ........ | 365/185.22 |

FOREIGN PATENT DOCUMENTS

JP 11-66898 3/1999

* cited by examiner

*Primary Examiner*—Thong Q. Le
(74) *Attorney, Agent, or Firm*—Oblon, Spivak, McClelland, Maier & Neustadt, P.C.

(57) ABSTRACT

A semiconductor memory device includes a memory cell array, word lines, bit lines, a control circuit, and a measurement circuit. The memory cell array has memory cells including a floating gate. The control circuit performs first control to collectively shift the threshold voltages of the memory cells to within a predetermined range with a first level as an upper limit, second control to shift a lower limit of the threshold voltages toward a second level lower than the first level, and third control to shift the lower limit to a third level. The measurement circuit measures the elapsed time from the start of the second control. The control circuit repeats the second control, and then terminates the second control when the lower limit reaches the second level or the elapsed time measured by the measurement circuit reaches the predetermined time and performing the third control.

18 Claims, 13 Drawing Sheets

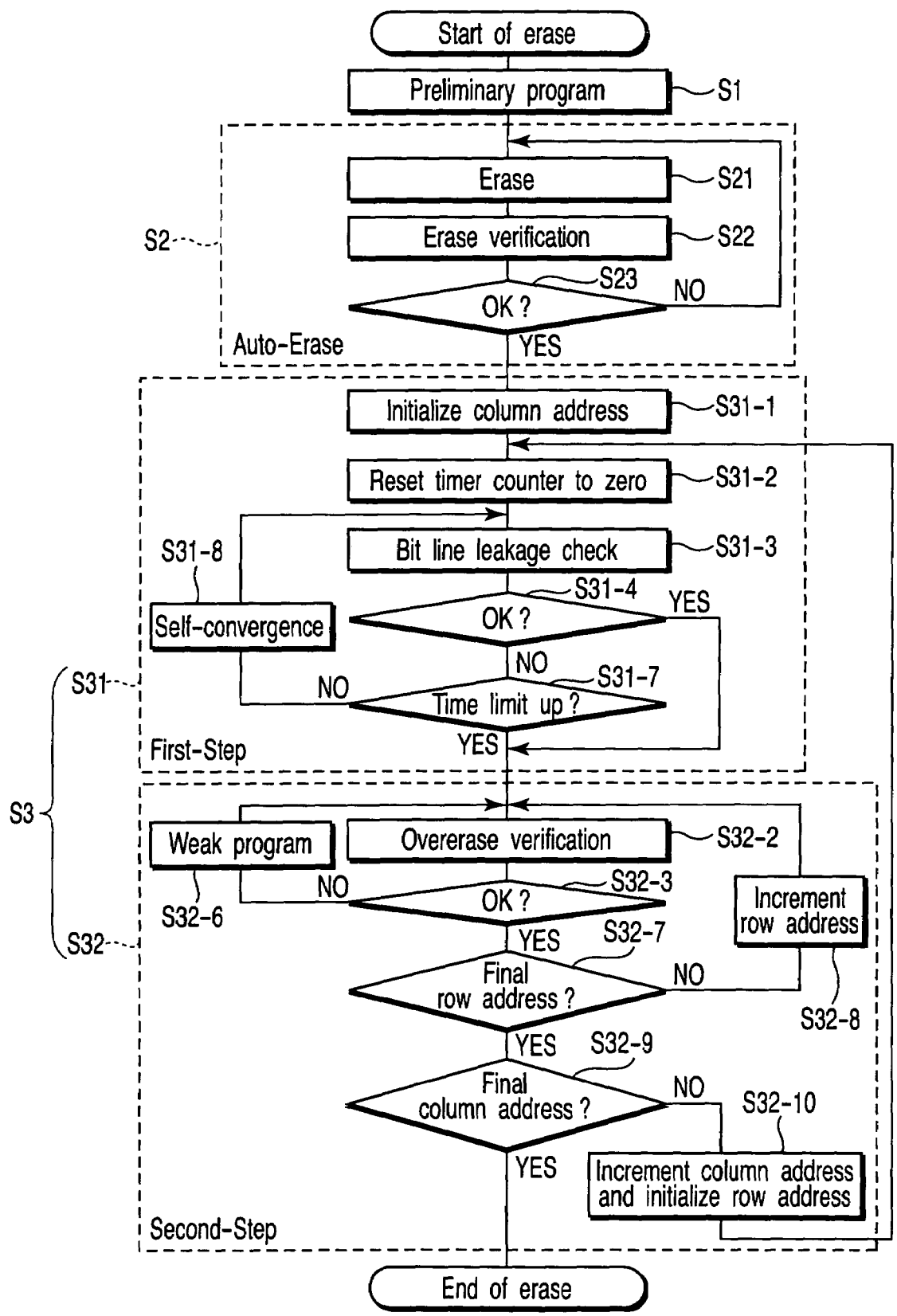
F I G. 20

SEMICONDUCTOR MEMORY DEVICE HAVING MEMORY CELLS WITH FLOATING GATES AND MEMORY CELL THRESHOLD VOLTAGE CONTROL METHOD

CROSS-REFERENCE TO RELATED APPLICATIONS

This application is based upon and claims the benefit of priority from prior Japanese Patent Application No. 2004-033491, filed Feb. 10, 2004, the entire contents of which are incorporated herein by reference.

BACKGROUND OF THE INVENTION

1. Field of the Invention

The present invention relates to a semiconductor memory device having memory cells with floating gates and a method of controlling the threshold voltages of the memory cells.

2. Description of the Related Art

Conventionally, flash memories have been extensively used as nonvolatile semiconductor memories.

The erase operation of the flash memories is performed by drawing electrons out of the floating gates. In the erase operation, a block of memory cells is erased at a time. In this case, there will exist overerased cells the threshold voltages of which have dropped too much lower than a constant lower-limiting value. After electrons have been drawn out of the floating gates, therefore, such processing as makes the threshold voltages of the overerased cells higher than the lower-limiting value is performed. The processing includes self-convergence processing and weak program processing. The self-convergence and the weak program have been proposed in, for example, Japanese Patent Application Publication KOKAI No. 11-66898 and U.S. Pat. No. 5,568,419, respectively.

With conventional flash memories, the threshold voltages of overerased cells are set higher than a constant value through the self-convergence or weak program processing. With the processing methods proposed so far, however, it takes a long time to raise the threshold voltages of the overerased cells. In addition, difficulties may be involved in making the threshold voltages of the overerased cells sufficiently high, in which case semiconductor memory devices are often discarded as faulty chips.

BRIEF SUMMARY OF THE INVENTION

A semiconductor memory device according to an aspect of the present invention comprising:

a memory cell array in which a plurality of memory cells each having a stacked gate including a floating gate and a control gate is arranged in rows and columns;

a plurality of word lines each of which connects commonly the control gates of the memory cells arranged in a respective one of the rows;

a plurality of bit lines each of which connects commonly drains of the memory cells arranged in a respective one of the columns;

a control circuit which performs first control to collectively shift the threshold voltages of the memory cells to within a predetermined range with a first level as an upper limit, second control to shift a lower limit of the threshold voltages shifted to within the predetermined range through the first control toward a second level lower than the first level, and third control to shift the lower limit of the threshold voltages shifted through the second control to a third level between the first and second levels; and a measurement circuit which measures the elapsed time from the start of the second control, the control circuit repeating A method of controlling a threshold voltage of a semiconductor memory device according to an aspect of the present invention, the device having memory cells each including a stacked gate containing a floating gate and a control gate, the method comprising:

collectively shifting the threshold voltage of the memory cells to within a predetermined range with a first level as its upper limit;

starting time measurement;

shifting the lower limit of the threshold voltages collectively shifted to within the predetermined range toward a second level lower than the first level;

repeating shifting the lower limit of the threshold voltages toward the second level until the lower limit of the threshold voltages reaches the second level or the elapsed time form the start of time measurement reaches a predetermined time; and shifting the lower limit of the threshold voltages to a third level between the first and second levels when the lower limit of the threshold voltages reaches the second level or the elapsed time from the start of time measurement reaches a predetermined time.

BRIEF DESCRIPTION OF THE SEVERAL VIEWS OF THE DRAWING

FIG. 20 is a flowchart illustrating a threshold voltage control method according to a modification of the first embodiment of the present invention.

DETAILED DESCRIPTION OF THE INVENTION

In the description which follows, in reading data, when a current that flows in a bit line is a predetermined value or more in magnitude (i.e., a memory cell is on), we shall refer it as data "1" or "1" readout. Conversely, when the current is less than the predetermined value (i.e., the memory cell is off), we shall refer it as data "0" or "0" readout. Although the embodiments of the invention will be described in terms of two-valued memories which can store data "0" and "1", the principles of the embodiment can naturally be applied to multiple-valued (over three data) memories.

Figure 1:
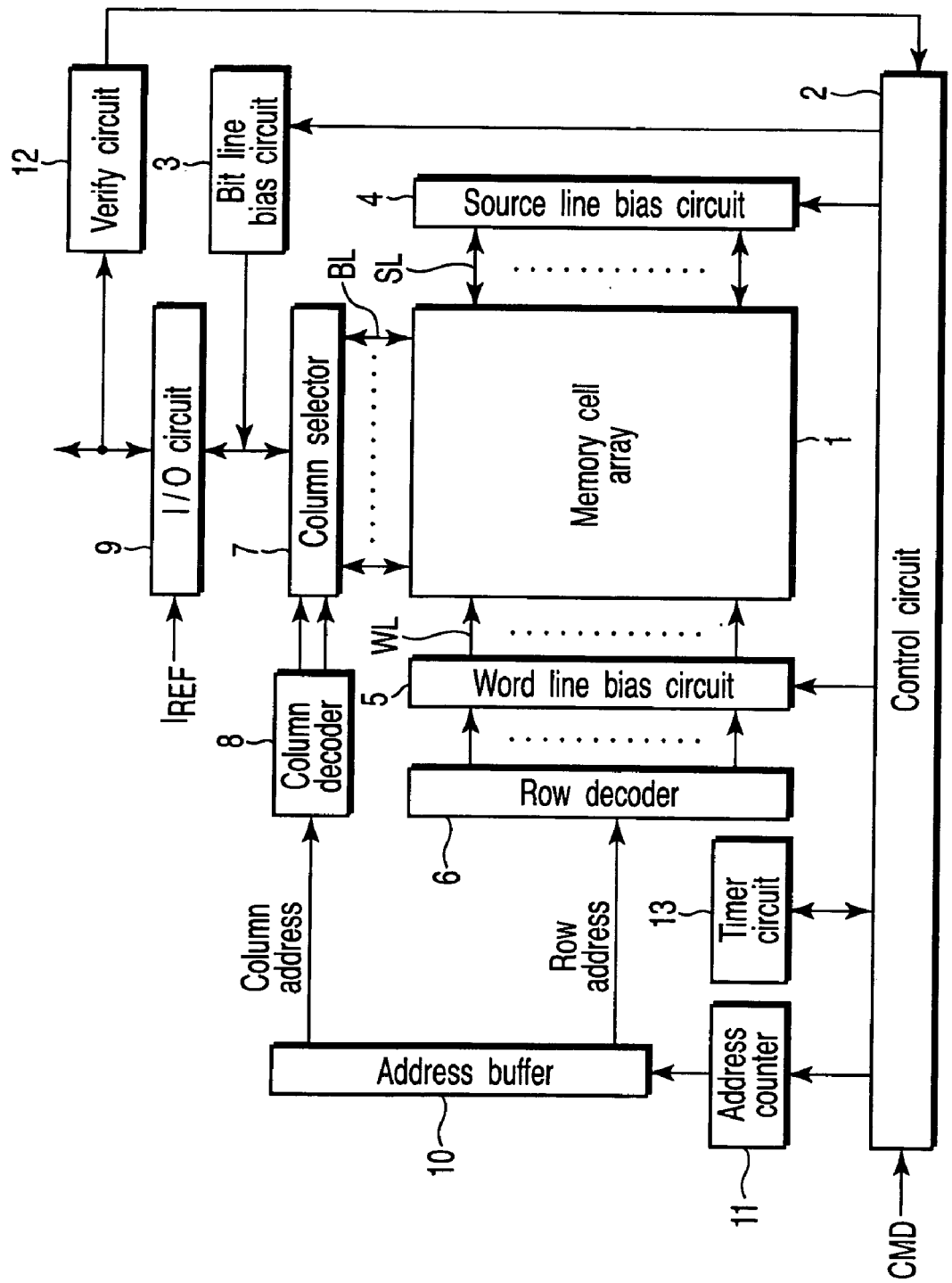
FIG. 1 is a block diagram of a flash memory according to a first embodiment of the present invention.

Reference is now made to FIG. 1 to describe a semiconductor memory device and a memory cell threshold voltage control method according to a first embodiment of the present invention. FIG. 1 is a block diagram of a NOR type of flash memory according to the first embodiment.

As shown, the flash memory comprises a memory cell array 1, a control circuit 2, a bit line bias circuit 3, a source line bias circuit 4, a word line bias circuit 5, a row decoder 6, a column selector 7, a column decoder 8, an I/O circuit 9, an address buffer 10, an address counter 11, a verify circuit 12, and a timer circuit 13.

Figure 2:
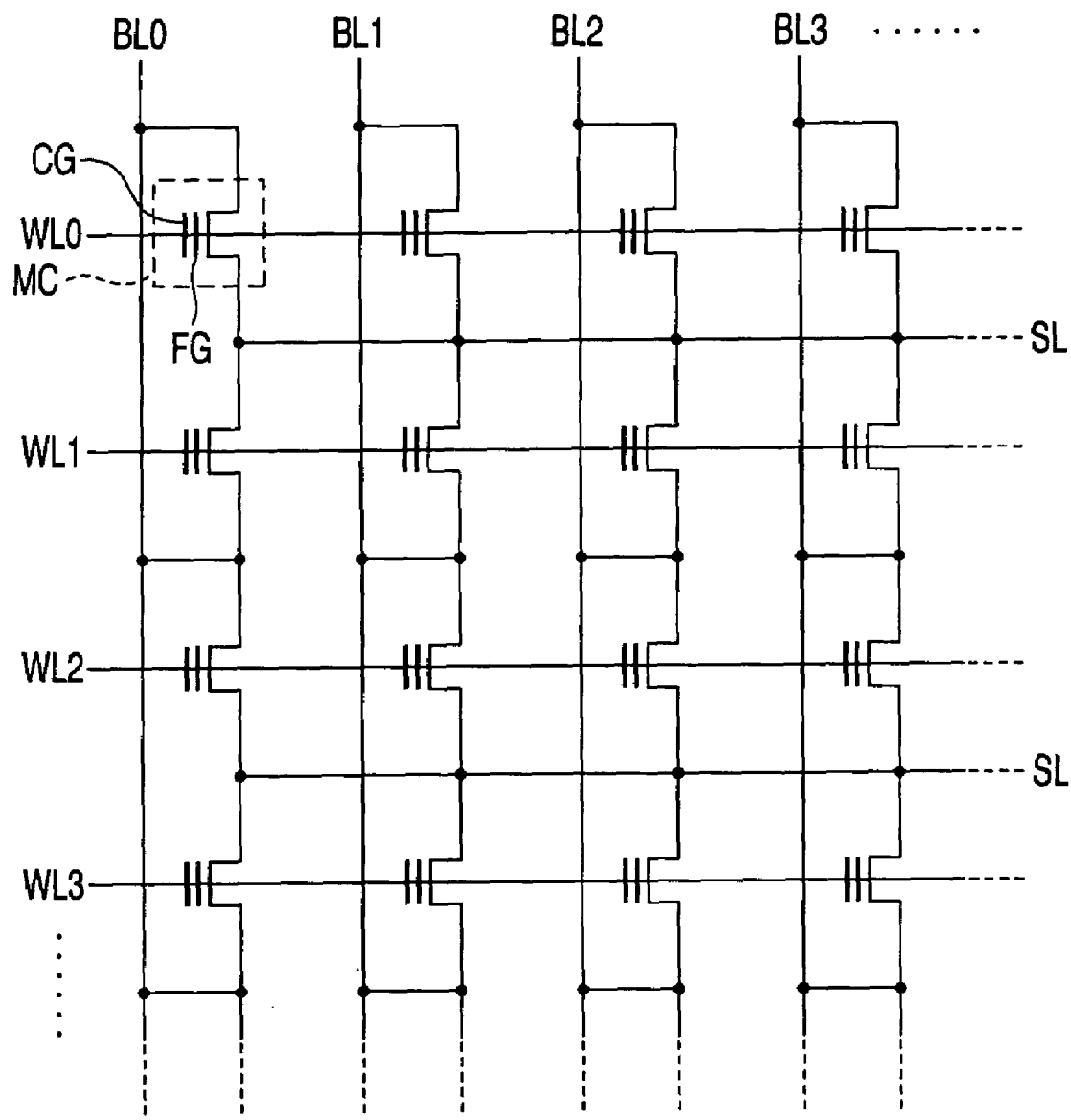
FIG. 2 is a circuit diagram of the memory cell array according to the first embodiment of the present invention.

The memory cell array 1 has a plurality of memory cells arranged in a matrix form of rows and columns. FIG. 2 is a circuit diagram of the memory cell array 1 of a NOR type of flash memory by way of example.

As shown in FIG. 2, a memory cell MC has a MOS transistor with a stacked-gate structure. The stacked-gate structure contains a floating gate FG formed on a semiconductor substrate with a gate insulting film interposed therebetween and a control gate CG formed on the floating gate FG with a gate insulating film interposed therebetween. The memory cell MC has its drain connected to a bit line BL, its source connected to a source line SL, and its control gate connected to a word line WL. The memory cells MC in the same row are connected commonly to the same word line WL. The memory cells MC in the same column are connected commonly to the same bit line BL. The threshold voltage Vth of the memory cell MC can be varied by changing the number of electrons which accumulate at the floating gate FG. Whether data to be stored in the memory cell MC is "1" or "0" depends on its threshold voltage Vth.

The control circuit 2 is responsive to an externally input command CMD to control the threshold voltages of the memory cells MC at data write operation or data erase operation. The control circuit 2 controls the bit line bias circuit 3, the source line bias circuit 4, and the word line bias circuit 5 to change the bias conditions of the memory cell array 1. The threshold voltages of the memory cells MC are controlled by changing the bias conditions of the memory cell array 1.

The address buffer 10 holds an address signal and supplies row and column addresses to the row decoder 6 and the column decoder 8, respectively.

The address counter 11 is adapted to, when a need arises to generate an address, which is usually supplied from outside, inside the chip, generate it on the basis of a control signal from the control circuit 2. The address counter 11 increments the address to generate different addresses in sequence and supplies them to the address buffer 10.

The row decoder 6 decodes a row address signal from the address buffer 10 to obtain a row address decoded signal. The row decoder selects a corresponding one of the word lines WL.

The column decoder 8 decodes a column address signal from the address buffer 10 to obtain a column address decoded signal. The column decoder selects a corresponding one of the bit lines BL.

The column selector 7 connects the bit line BL selected by the column decoder 8 to the I/O circuit 9.

The bit line bias circuit 3 applies a bit line bias voltage to the bit line BL selected by the column decoder 8. The bit line bias circuit 3 is responsive to a control signal from the control circuit 2 to switch the bit line bias voltage between data read operation and data write operation.

The word line bias circuit 5 applies a word line bias voltage to a word line WL selected by the row decoder 6 or to all the word lines WL. The word line bias circuit 5 is responsive to a control signal from the control circuit 2 to change the word line bias voltage according to each of the memory operations: data read, data write, and data erase.

The source line bias circuit 4 applies a source bias voltage to the source lines SL. The source line bias voltage is usually 0 volts. With a data erase scheme based on discharge of electrons to the source lines SL, however, the source line bias voltage is set higher than 0 volts at data erase operation on the basis of a control signal from the control circuit 2.

The I/O circuit 9 determines whether a bit of read data is either "0" or "1" by making a comparison between a current flowing in a selected bit line BL and a predetermined value IREF.

The verify circuit 12 detects whether or not the threshold voltage Vth of a memory cell MC is at a desired level when the data is written into or erased. In verification after the write operation or the erase operation, the verify circuit 12 detects whether or not the threshold voltage Vth is at the desired level on the basis of the determination by the I/O circuit 9 of whether read data is "0" or "1".

The timer circuit 13 measures time according to an instruction by the control circuit 2. More specifically, the timer circuit measures the elapsed time from the start of a self-convergence process at data erase operation.

Figure 3:
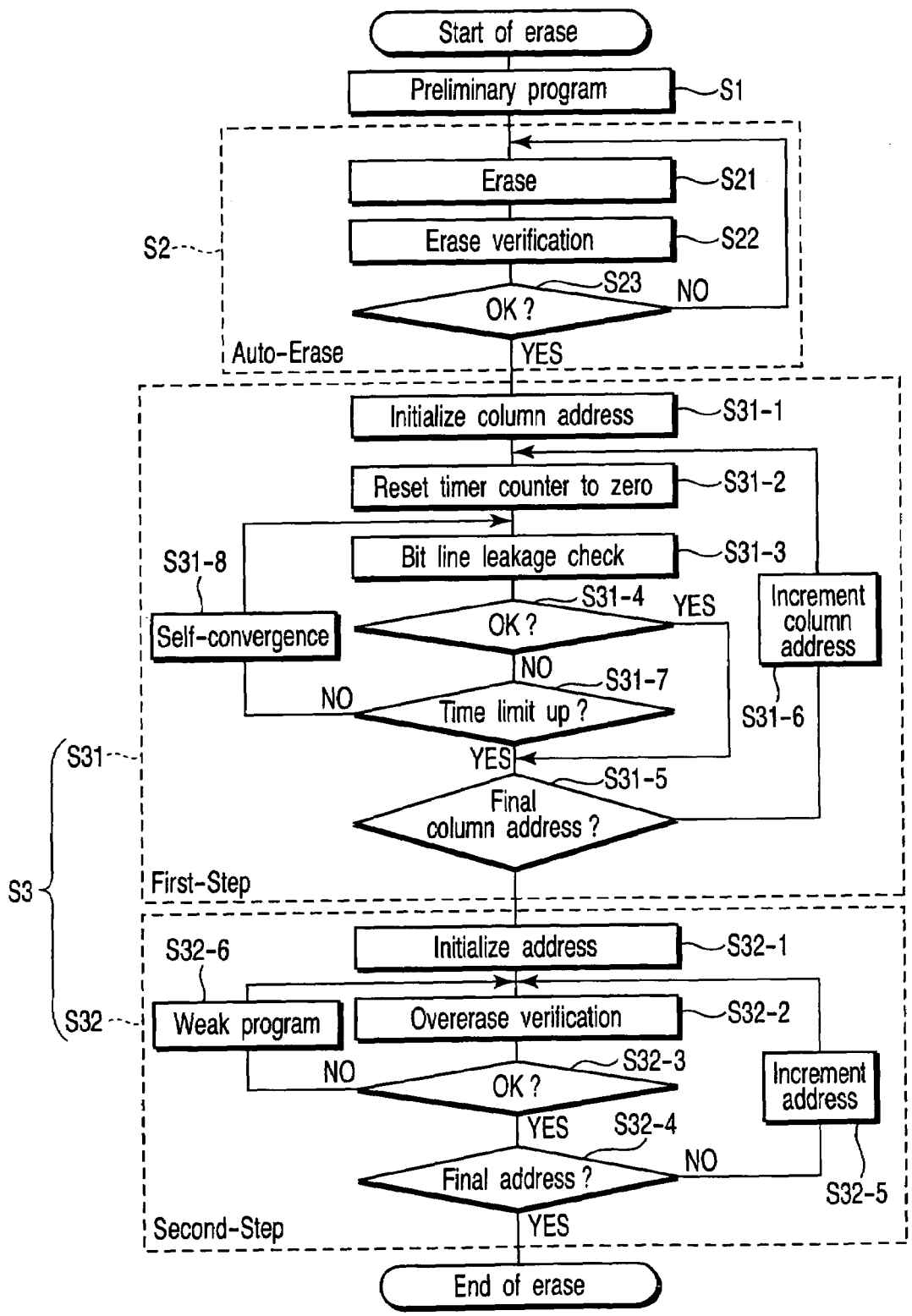
FIG. 3 is a flowchart illustrating a threshold voltage control method of the flash memory according to the first embodiment of the present invention.

Next, the threshold voltage control method of the NOR type of flash memory according to this embodiment will be described with reference to FIG. 3. FIG. 3 is a flowchart illustrating the threshold voltage control method, which is applied to data erase sequence in particular.

Figure 4:
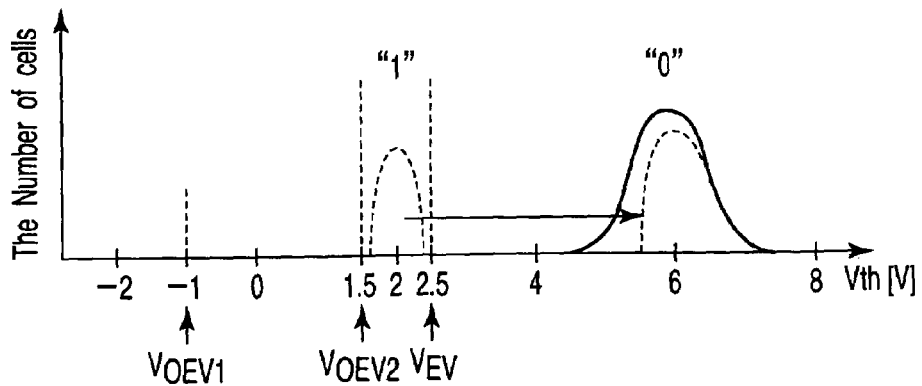
FIGS. 4 through 8 show number of memory cells versus threshold voltage for the flash memory according to the first embodiment of the present invention.

First, prior to data erase, a preliminary program (Pre-Program) is executed in step S1. At preliminary program, write pulse is applied to all or part of the word and bit lines within a block to be erased and sets all the memory cells to the "0" or "1" state. FIG. 4 shows a distribution of the threshold voltages Vth of the memory cells at the termination of the preliminary program. As shown in FIG. 4, in this example, the threshold voltages Vth of all the memory cells MC are shifted in the direction of data "0" so that their distribution becomes opposite to that after data erase.

Next, in step S2, data erase is carried out, thereby causing a distribution of the threshold voltages of all the memory cells to be shifted in the direction from "0" to "1".

Figure 5:
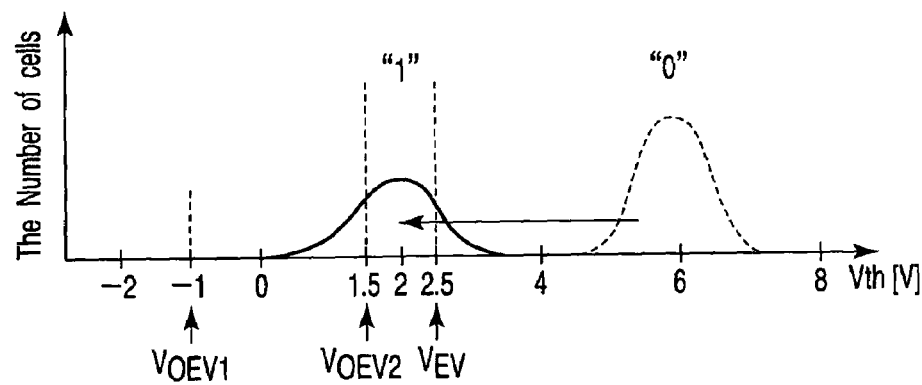

In this embodiment, a scheme which is referred to as auto-erase is adopted for data erase. In the auto-erase, data is erased in substep S21, then erase verification is carried out in substep S22 and a decision is made in substep S23 as to whether or not the threshold voltages Vth of the memory cells are less than an erase verification voltage VEV. If the threshold voltages Vth are the erase verification voltage VEV or more, then data erase is repeated (substep S21). FIG. 5 shows a distribution of the threshold voltages during auto-erase and FIG. 6 shows a distribution of the threshold voltages at the termination of auto-erase.

Figure 6:
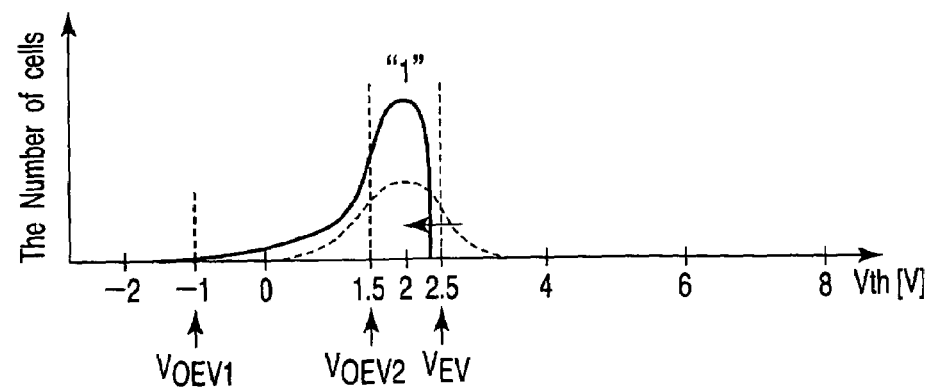

Thus, by repeating the erase verification and the data erase, the threshold voltages Vth of all the memory cells are first set such that Vth<VEV as shown in FIG. 6.

Next, in step S3, the width of the distribution of the threshold voltages Vth is reduced. In this embodiment, to reduce the distribution width, the lower limiting value Vth-min of the threshold voltages Vth is raised stepwise in at least two steps.

To this end, this embodiment contains a first step (step S31) to raise the lower limiting value Vth-min to a first lower limiting value and a second step (step S32) to further increase the first lower limiting value to a second lower limiting value close to the erase verification voltage VEV. The first and second steps (steps S31 and S32) will be described hereinafter.

The object of the first step (step S31) is to set the lower limiting value Vth-min of the threshold voltages Vth higher than a first overerase verification voltage VOEV1. That is, the object is to set the threshold voltages Vth of all the memory cells such that VOEV1<Vth<VEV.

A method to achieve the object is to reduce currents flowing in the bit lines below a predetermined value I REF-LEAK under the condition that all the word lines within a block to be erased are supplied with a constant bias voltage.

An example of the constant bias voltage applied to all the word lines is the first overerase verification voltage VOEV1, which is, say, −1 volts. To set the threshold voltage Vth higher than −1 volts, it is recommended that a predetermined value I REF-LEAK be set smaller than the predetermined value I REF at data read operation.

Suppose that a current of more than 10 µA flows in the bit lines when the voltage on the word lines goes higher than the threshold voltage Vth by more than 1 volts. The value of 10 µA is taken as the predetermined value I REF for distinguishing between "0" readout and "1" readout at data read operation. In this case, if the bit line current is 10 µA or more, it is taken as "1" readout. Conversely, if the bit line current is less than 10 µA, it is taken as "0" readout.

Thus, when the predetermined value I REF at read time is set at 10 µA, the predetermined value I REF-LEAK at the time of leak current detection (hereinafter referred to as bit line leakage check) is set to less than 10 µA, say, 1 µA. That is, if a current of 1 µA or more flows in the bit line at the bit line leak check time, it is taken as "1" readout. Conversely, if the bit line current is less than 1 µA, it is taken as "0" readout.

Suppose now that a constant bias voltage applied to the word lines is −1 volts. Then, if the bit line current I≧10 µA, it can be assumed that Vth≦−2 V.

Further, if 10 µA>I≦1 µA, it can be assumed that −2 V<Vth≦−1 V.

Thus, setting I<1 µA will lead to Vth>−1 V.

Thus, the predetermined value for distinguishing between "0" readout and "1" readout is set more strictly at bit line leak check time than at data read operation. For example, the bit line current is set to less than 1 µA. Thereby, the threshold voltage Vth can be set to more than VOEV1, the first overerase verification voltage.

Although the predetermined value I REF-LEAK has been described as being 1 µA, it is only required that this value be set suitably in consideration of some factors including capacitance associated with the bit lines.

As a method to set the bit line current to less than 1 µA, in other words, to set Vth to more than VOEV1 (i.e., the first overerase verification voltage), use may be made of self-convergence. Hereinafter, a description is given of the case where self-convergence is used in step S31.

Referring back to FIG. 3, the column addresses are first initialized in substep S31-1.

Next, in substep S31-2, the counter in the timer circuit 13 is reset to 0 to start time measurement. The timer circuit 13 measures the elapsed time from the start of the self-convergence process (i.e., the time taken to perform step S31).

Figure 9:
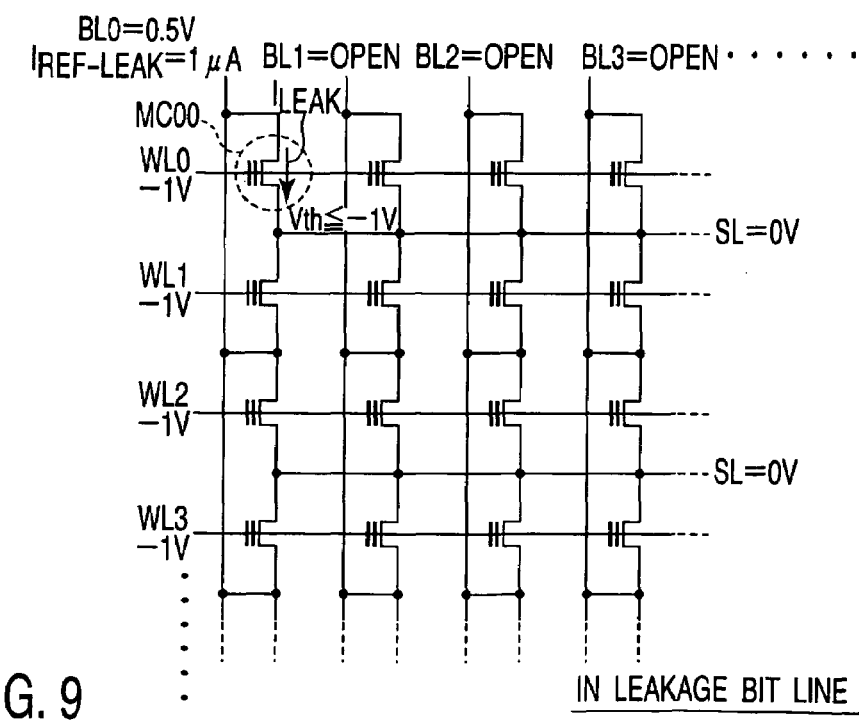
FIG. 9 is a circuit diagram of the memory cell array and shows bias conditions of the memory cell array at bit line leakage check in the flash memory according to the first embodiment of the present invention.

Next, a bit line leak check is made in substep S31-3. This involves selecting the bit line BL0 through the initialized column addresses and detecting a leak current in the selected bit line BL0. The predetermined value I REF-LEAK at this time is set to less than the predetermined value I REF at read operation, say, 1 µA. In FIG. 9, there are shown the bias conditions of the memory cell array 1 at leakage current detection time.

As shown in FIG. 9, all the word lines within a block to be erased are placed in non-selected state. That is, they are supplied with a non-selection bias voltage of, say, −1 volts by the word line bias circuit 5. The selected bit line BL0 is supplied with a read bias voltage of, say, 0.5 volts by the bit line bias circuit 3. The non-selected bit lines BL1, BL2, BL3, and so on are placed in the open state or set at 0 volts. The source lines SL are set at 0 volts.

Next, in substep S31-4, a decision is made as to whether the leakage current flowing in the selected bit line BL0 is less than 1 µA or not under the bias conditions shown in FIG. 9. This is performed by comparing the magnitude of the leakage current flowing in the bit line BL0 with the predetermined value I REF-LEAK to determine either "0" readout or "1" readout.

If the result of the decision is "0" readout, that is, the leakage current is less than 1 µA, then the procedure goes to substep S31-5.

In substep S31-5, a decision is made as to whether or not the column address is the final address. If so, the first step S31 is complete and the procedure then goes to the second step S32. Otherwise, the column address is incremented by one in substep S31-6 and then the procedure returns to substep S31-2.

With the example shown in FIG. 9, the threshold voltage Vth of the memory cell MC00 is Vth≦−1 V. Therefore, when the process of substep S31-3 is performed on the bit line BL0, a leakage current of 1 µA or more is detected in the selected bit line BL0. Thus, it can be assumed that cells the threshold voltage Vth of which is −1 volts or less are connected to the bit line BL0.

Figure 10:
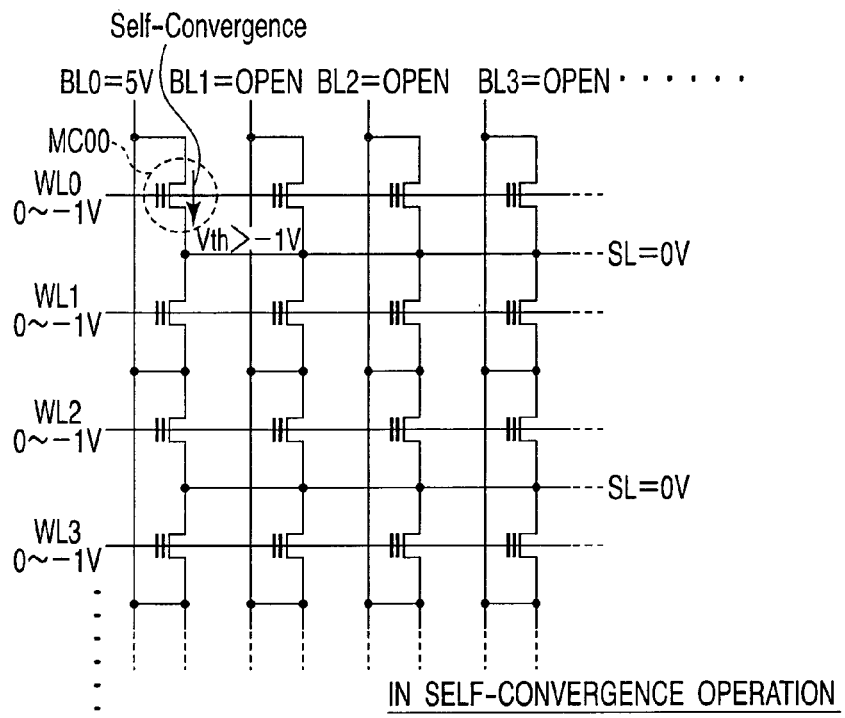
FIG. 10 is a circuit diagram of the memory cell array and shows bias conditions of the memory cell array at self-convergence in the flash memory according to the first embodiment of the present invention.

Therefore, the procedure then goes to substep S31-7 because it will be decided in substep S31-4 that the leakage current is 1 µA or more. In substep S31-7, the control circuit 2 checks the time being measured by the timer circuit 13. That is, a decision is made as to whether or not the elapsed time from substep S31-2 is within a predetermined time. If the predetermined time has passed, then the procedure goes to substep S31-5. Otherwise, the procedure goes to substep S31-8 in which self-convergence is performed. FIG. 10 shows the bias conditions of the memory cell array 1 at self-convergence.

As shown, the bit line bias circuit 3 applies a self-convergence bias voltage higher than the read bias voltage to the selected bit line BL0. The self-convergence bias voltage is the same as the write bias voltage, say, 5 volts. The non-selected bit lines BL1, BL2, BL3 and so on are placed in the open state or set at 0 volts. The source lines SL are set at 0 volts. The word line bias circuit 5 supplies the word lines WL0, WL1, WL2, and so on with a bias voltage most suitable for self-convergence, which is in the range of, say, 0 to 1 volt. By setting up such bias conditions, self-convergence is performed on the memory cells MC connected to the bit line BL0 with the result that the threshold voltage of each of the memory cells is raised.

Upon termination of the self-convergence, the procedure returns to substep S31-3. That is, a leakage check is performed on a bit line and, in the presence of leakage, self-convergence is repeated until the leakage dies out or the time limit is up. When the leakage has died out or when a constant time has elapsed after the start of the self-convergence regardless of the presence of leakage, the self-convergence on that bit line is completed and the same processing is then performed on the next bit line.

In the example of FIG. 9, suppose that the self-convergence (substep S31-8) has raised the threshold voltage Vth of the memory cell MC00 above −1 volts. Then, the procedure goes to substep S31-5 since no leakage will be detected by the bit line leakage check (substeps S31-3 and S31-4). Since the final column address is not yet reached, the column address is incremented by one (substep S31-6). The same processing as with the bit line BL0 is then performed on the bit line BL1.

Figure 11:
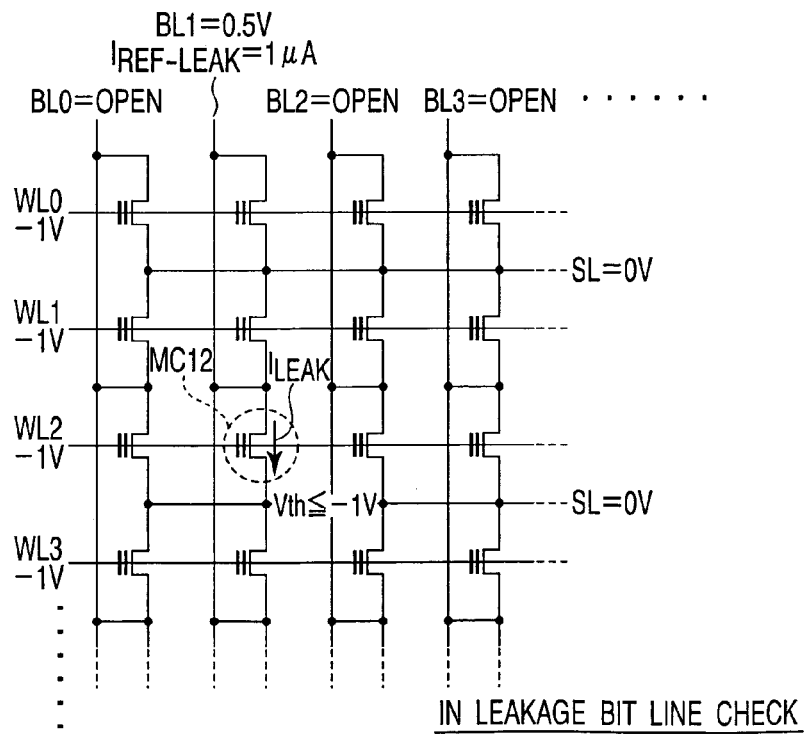
FIG. 11 is a circuit diagram of a part of the memory cell array and shows bias conditions of the memory cell array at bit line leakage check in the flash memory according to the first embodiment of the present invention.
Figure 12:
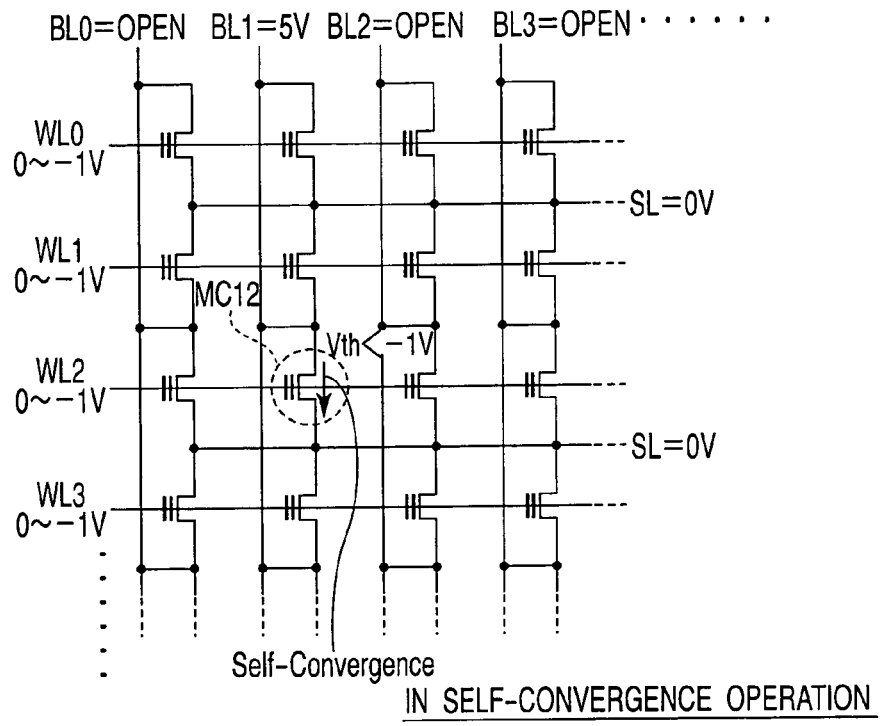
FIG. 12 is a circuit diagram of a part of the memory cell array and shows bias conditions of the memory cell array at self-convergence in the flash memory according to the first embodiment of the present invention.

That is, the counter in the timer circuit 13 is reset to 0 to start time measurement (substep S31-2). Next, a leakage check is made on the bit line BL1 (substep S31-3). This situation is illustrated in FIG. 11. Suppose here that the threshold voltage Vth of the memory cell MC12 connected to the bit line BL1 is −1 volts or less. Then, a leakage current of 1 µA or more is detected in the bit line BL1 (substep S31-4). Next, the control circuit 2 makes a decision of whether or not the elapsed time measured by the timer circuit 13 is within the predetermined time (substep S31-7). If so, the procedure goes to substep S31-8 to perform self-convergence on the memory cells MC connected to the bit line BL1. The self-convergence and the leakage check are repeated until the bit line leakage dies out or the time limit is up. Suppose here that, as shown in FIG. 12, the elapsed time measured by the timer circuit 13 has passed the predetermined time before the threshold voltage Vth of the memory cell MC12 exceeds −1 volts (substep S31-8). That is, assume that the self-convergence has failed to make the threshold voltage higher than VOEV1 within the predetermined time. In that case, the procedure goes to step S31-5 without performing the self-convergence again with the threshold voltage Vth of the memory cell MC12 remaining at −1 volts or less. The processes in steps S31-2 through S31-8 are then performed on the bit line BL3 and so on.

Figure 7:
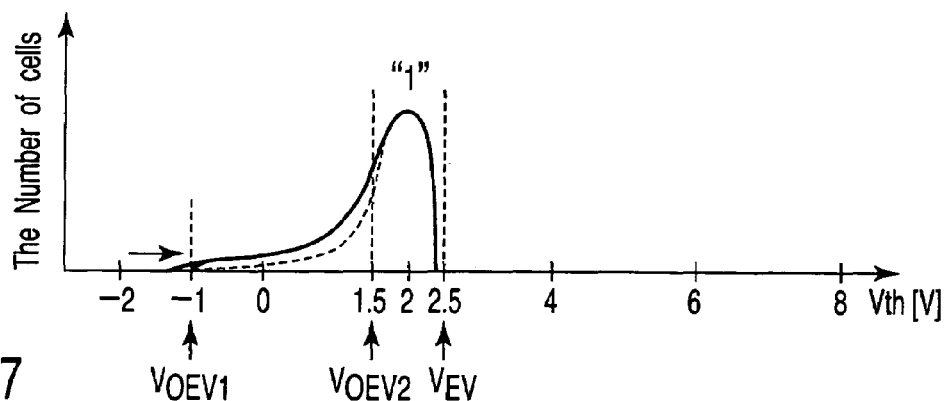

Upon completion of the process in step S31 on all the bit lines, the procedure next goes to step S32. FIG. 7 shows the distribution of the threshold voltages of the memory cells after the termination of the first step (step S31). As shown, the self-convergence changes the threshold voltages of many of the memory cells in which the threshold voltage is −1 volts or less to more than −1 volts. If the bit line leakage has died out for all the bit lines, the threshold voltages Vth of all the memory cells are set such that VOEV1<Vth<VEV. In the presence of bit lines in which the bit line leakage has not died out within the time limit, however, the threshold voltages Vth of some memory cells connected to such bit lines still remain at VOEV1 or less.

Next, the second step (step S32) will be described. In the second step, the weak program scheme is used. The weak program is performed for each individual memory cell unlike the self-convergence which is performed for each bit line.

First, in substep S32-1, the addresses are initialized.

Figure 13:
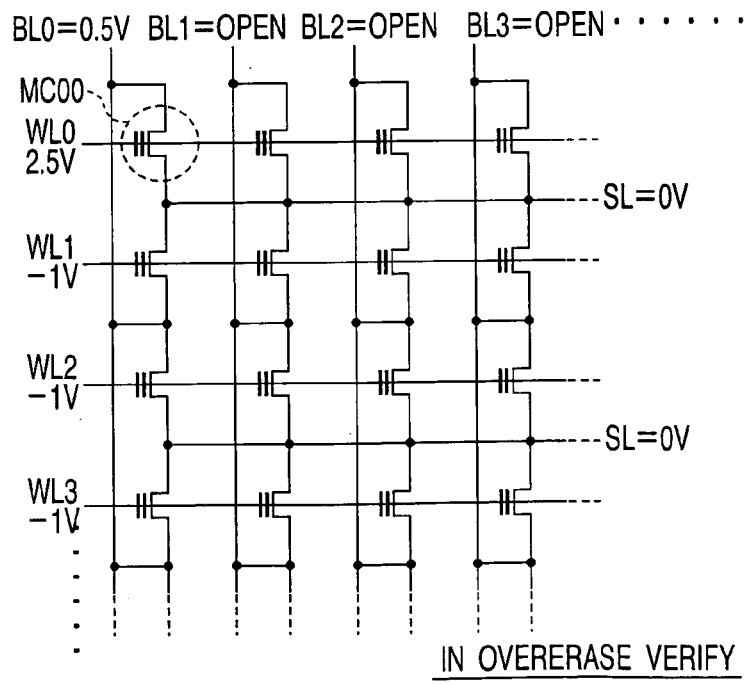
FIG. 13 is a circuit diagram of a part of the memory cell array and shows bias conditions of the memory cell array at overerase verification in the flash memory according to the first embodiment of the present invention.

Next, in substep S32-2, overerase verification is performed. FIG. 13 shows the bias conditions of the memory cell array 1 at overerase verification. As shown, the word line WL0 selected by the initialized addresses is supplied with an overerase verification bias voltage from the word line bias circuit 5. The overerase verification bias voltage is set at 2.5 volts, for example, which is 1 volt higher than a second overerase verification bias voltage VOEV2 which is set at 1.5 volts. The reason why the overerase verification bias voltage is set 1 volt higher than VEOV2 is that a current which flows in the bit line when the voltage on the word line goes higher than the threshold voltages Vth of memory cells by 1 volt or more is set at 10 µA and this is defined as the predetermined value I REF at overerase verification. This predetermined value I REF is the same as the one at read operation.

The non-selected word lines WL1, WL2, WL3, and so on are supplied with a non-selection bias voltage of the order of, say, −1 volts.

Next, the bit line BL0 selected by the initialized addresses is supplied with a read bias voltage of the order of, say, 0.5 volts from the bit line bias circuit 3. Thereby, the memory cell MC00 is selected as a candidate cell for overerase verification. The non-selected bit lines BL1, BL2, BL3 and so on are placed in the open state or supplied with 0 volts. The source lines are supplied with 0 volts.

Next, in substep S32-3, a decision is made as to whether or not the on current flowing in the selected bit line BL0 is less than 10 µA under the bias conditions shown in FIG. 13. This is achieved by comparing the magnitude of the on current in the bit line BL0 with the predetermined value I REF to determine either "0" readout or "1" readout.

When the threshold voltage Vth of the memory cell MC00 is Vth>1.5 volts and the bit line leakage current is less than 10 µA, the procedure goes to substep S32-4.

In substep S32-4, a decision is made as to whether or not the address is the final address. If the final address is not reached, the procedure goes to substep S32-5 in which the address is incremented by one. The procedure then returns to substep S32-2.

Figure 14:
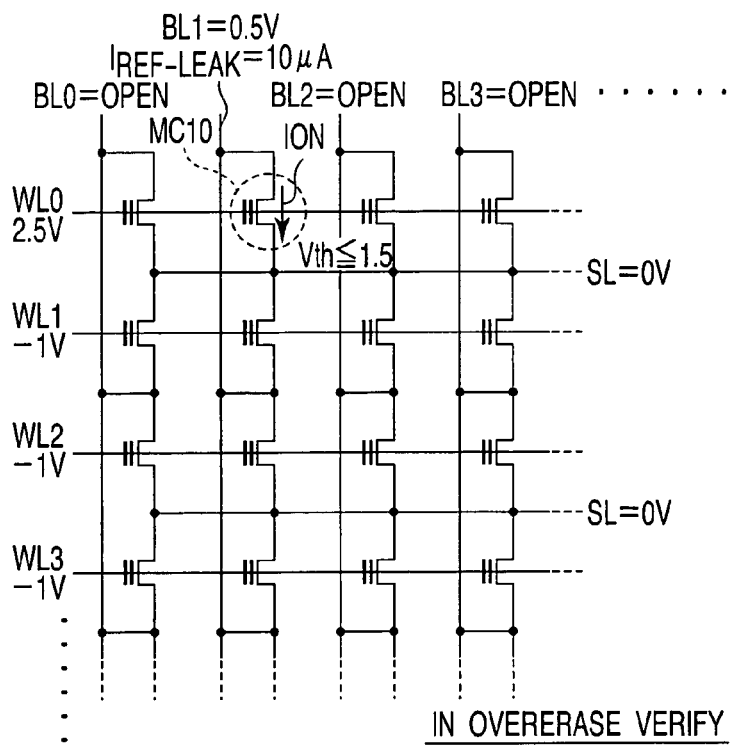
FIG. 14 is a circuit diagram of a part of the memory cell array and shows bias conditions of the memory cell array at overerase verification in the flash memory according to the first embodiment of the present invention.

In substep S32-2, the bit line BL1 is selected in place of the bit line BL0 as the result of incrementing the address and supplied with the read bias voltage (0.5 volts) as shown in FIG. 14. In this way, the memory cell MC10 is selected as a candidate cell for overerase verification.

Next, in substep S32-3, a decision is made as to whether or not the on current flowing in the selected bit line BL1 is less than 10 µA under the bias conditions shown in FIG. 14. If the on current is 10 µA or more (NO in substep (S32-3)), it can be assumed that the threshold voltage Vth of the selected memory cell MC10 is 1.5 volts or less as shown in FIG. 14.

Figure 15:
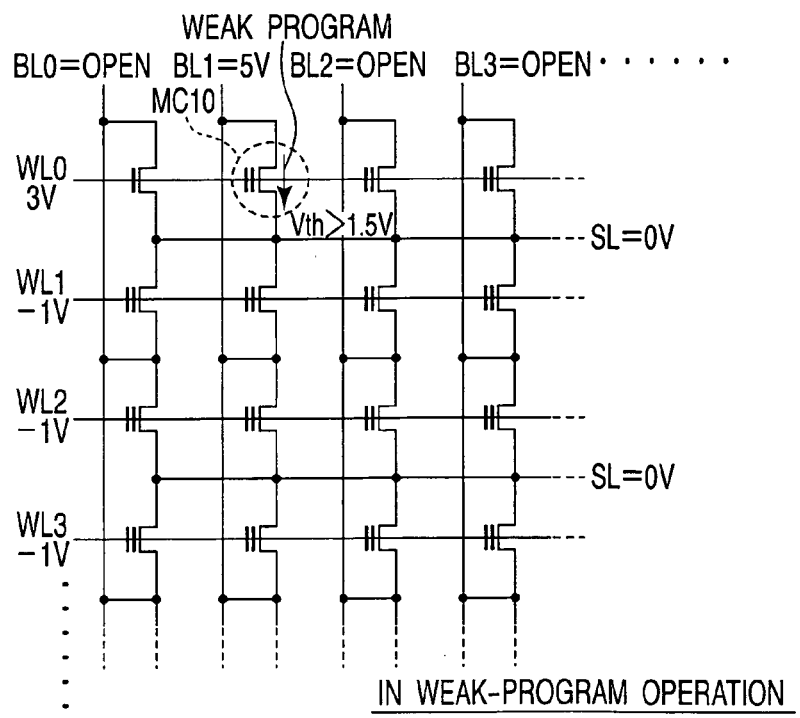
FIG. 15 is a circuit diagram of a part of the memory cell array and shows bias conditions of the memory cell array at weak program in the flash memory according to the first embodiment of the present invention.

The procedure thus goes to substep S32-6 to execute the weak program. FIG. 15 shows the bias conditions of the memory cell array 1 at weak program execution. As shown, the selected word line WL0 is supplied with a weak program word line bias voltage of the order of, say, 3 volts from the word line bias circuit 5. The non-selected word lines WL1, W12, WL3, and so on are supplied with a non-selection bias voltage of the order of −1 volts. The selected bit line BL1 is supplied by the bit line bias circuit 3 with a weak program bit line bias voltage, which is the same as the write bias voltage, of the order of 5 volts. The non-selected bit lines BL0, BL2, BL3, and so on are placed in the open state or set at 0 volts. The source lines SL are set at 0 volts.

By setting up the bias conditions shown in FIG. 15, the weak program is performed on the memory cell MC10, causing its threshold voltage to rise. In such a weak program operation, electrons are injected from the drain into the floating gate by positively applying voltages to the word line WL0 and the bit line BL1 which are connected to the selected memory cell MC10. To this end, the weak program bias voltage applied to the selected word line WL0 and the write bias voltage applied to the selected bit line BL1 are simply applied in the form of pulses with microsecond order width as in the case of usual write operations.

The weak program bias voltage is set to a value less than a usual program bias voltage, which is, say, of the order of 9 volts. This makes the number of electrons injected into the floating gate of the selected memory cell MC10 at weak program time smaller than at usual program time. Thus, the value by which the threshold voltage Vth of the selected memory cell MC10 is raised at weak program becomes smaller than at usual program. That is, the weak program allows the threshold voltage Vth to be raised slightly.

Upon completion of the weak program, the procedure goes to substep S32-3 in which the overerase verification is performed under the bias conditions shown in FIG. 14. If the result is that the on current in the bit line BL1 is 10 µA or more (NO in substep S32-3), then the weak program operation is repeated in substep S32-6. If, on the other hand, the on current is less than 10 µA (YES in substep S32-3), then the procedure goes to substep S32-4.

In substep S32-4, a decision is made as to whether or not the final address has been reached. If not, the procedure goes to substep S32-5 to increment the address. The procedure then returns to substep S32-2.

After the column address has been incremented to the final address, it is initialized to zero (initial value). The row address is then incremented to select the word line WL1 in place of the word line WL0. In this way, a decision is made as to whether or not a weak program is needed for each of the memory cells within a block to be erased. The weak program is performed when necessary. Of course, it is allowed to, after a bit line has been selected, sequentially increment the row address and then increment the column address after the row address has reached the final address.

Figure 16:
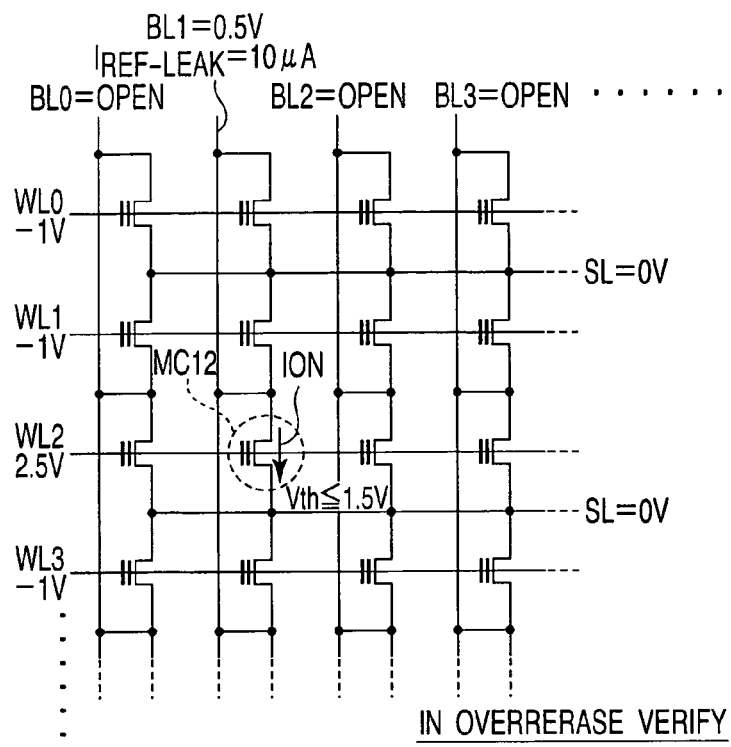
FIG. 16 is a circuit diagram of a part of the memory cell array and shows bias conditions of the memory cell array at overerase verification in the flash memory according to the first embodiment of the present invention.
Figure 17:
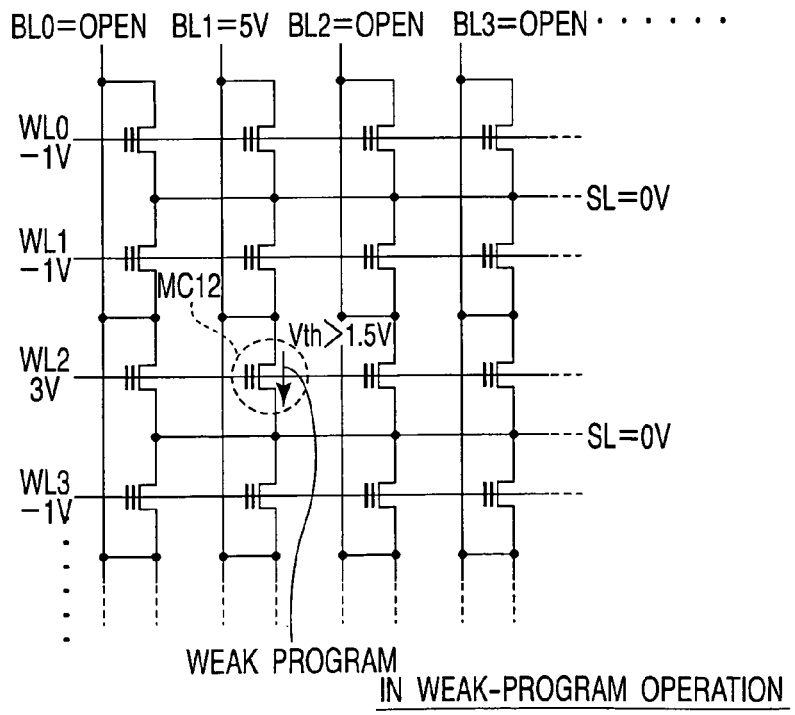
FIG. 17 is a circuit diagram of a part of the memory cell array and shows bias conditions of the memory cell array at weak program in the flash memory according to the first embodiment of the present invention.

Naturally, memory cells the threshold voltages Vth of which were not raised above VOEV1 within the predetermined time in the self-convergence process in the first step (step S31) become candidates for weak program in the second step (step S32). As described with reference to FIG. 12, for the memory cell MC12, although its threshold voltage Vth is less than −1 volts, the self-convergence process was prematurely terminated because the predetermined time has passed. In the overerase verification (substep S32-3), therefore, an on current of 10 µA or more will flow in the memory cell MC12 as shown in FIG. 16. Thus, as shown in FIG. 17, the threshold voltage Vth of the memory cell MC12 is set to go higher than 1.5 volts by the weak program.

Figure 8:
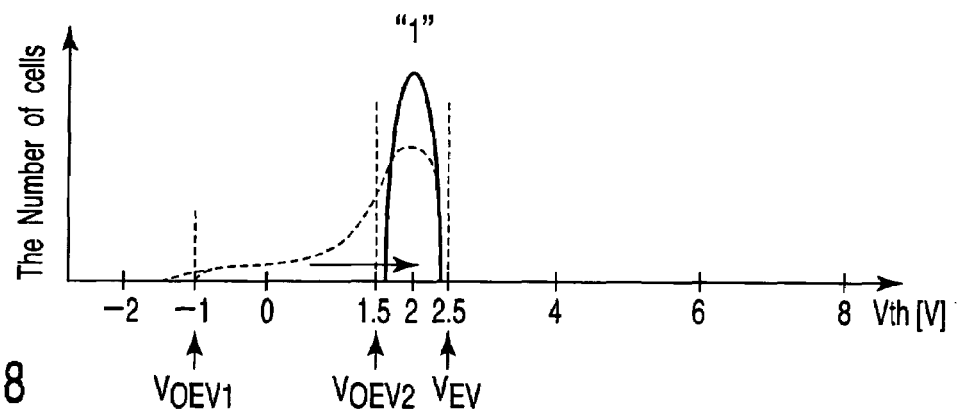

Upon termination of the process up to the final address, the second step is completed. FIG. 8 shows the distribution of the threshold voltages of the memory cells after the termination of the second step. As shown, the threshold voltages Vth of all the memory cells are set such that VOEV2<Vth<VEV.

Thus, when the second step terminates, the data erase sequence according to this embodiment is completed.

As described above, the flash memory and the memory cell threshold voltage control method according to the first embodiment of the present invention offer the following advantages (1) and (2):

(1) The erase operation can be speeded up.

With the threshold voltage control method according to this embodiment, the timer circuit 12 measures the elapsed time from the start of the self-convergence process (the time taken to perform the self-convergence process). The control circuit 2 terminates the self-convergence process when a predetermined time has elapsed from the start of the self-convergence process. Memory cells for which the self-convergence process have been prematurely terminated are remedied by the next weak program process. Therefore, it is possible to set the self-convergence process time short. More specifically, the self-convergence time, which was conventionally required to be several milliseconds, can be set to several microseconds according to the method of the first embodiment.

(2) The efficiency of remedying memory cells can be improved.

According to the threshold voltage control method of the first embodiment, the threshold voltages of memory cells for which the self-convergence process has failed to set their threshold voltages to within a predetermined range can be set to within the predetermined range by the subsequent weak program process. That is, such memory cells are remedied by the weak program, otherwise the corresponding chip would be judged to be a faulty chip as with conventional memory chips. Thus, chips which would be judged to be faulty according to the conventional method can also be remedied, allowing the efficiency of remedying memory cells to be improved.

Figure 18:
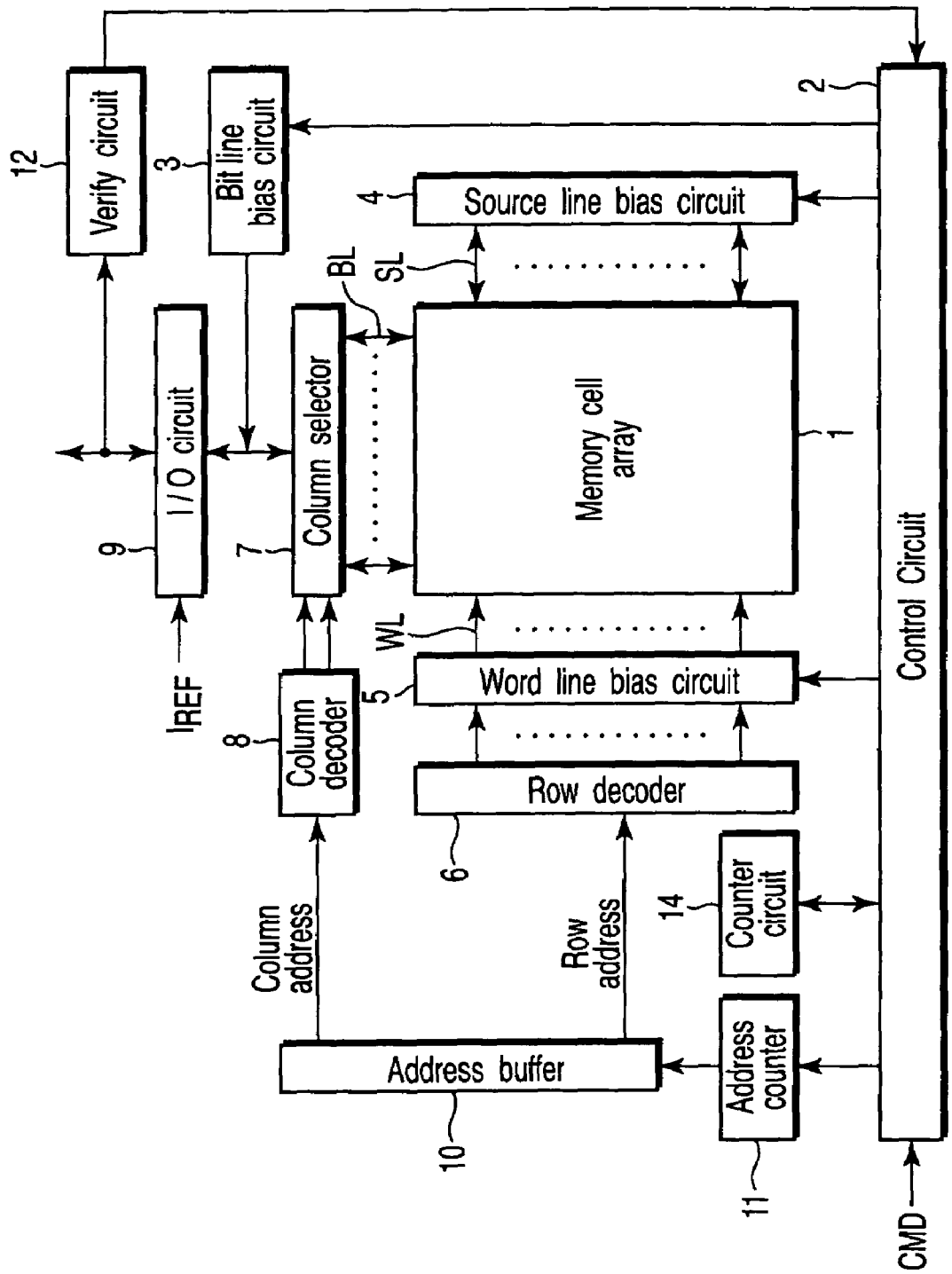
FIG. 18 is a block diagram of a flash memory according to a second embodiment of the present invention.
Figure 19:
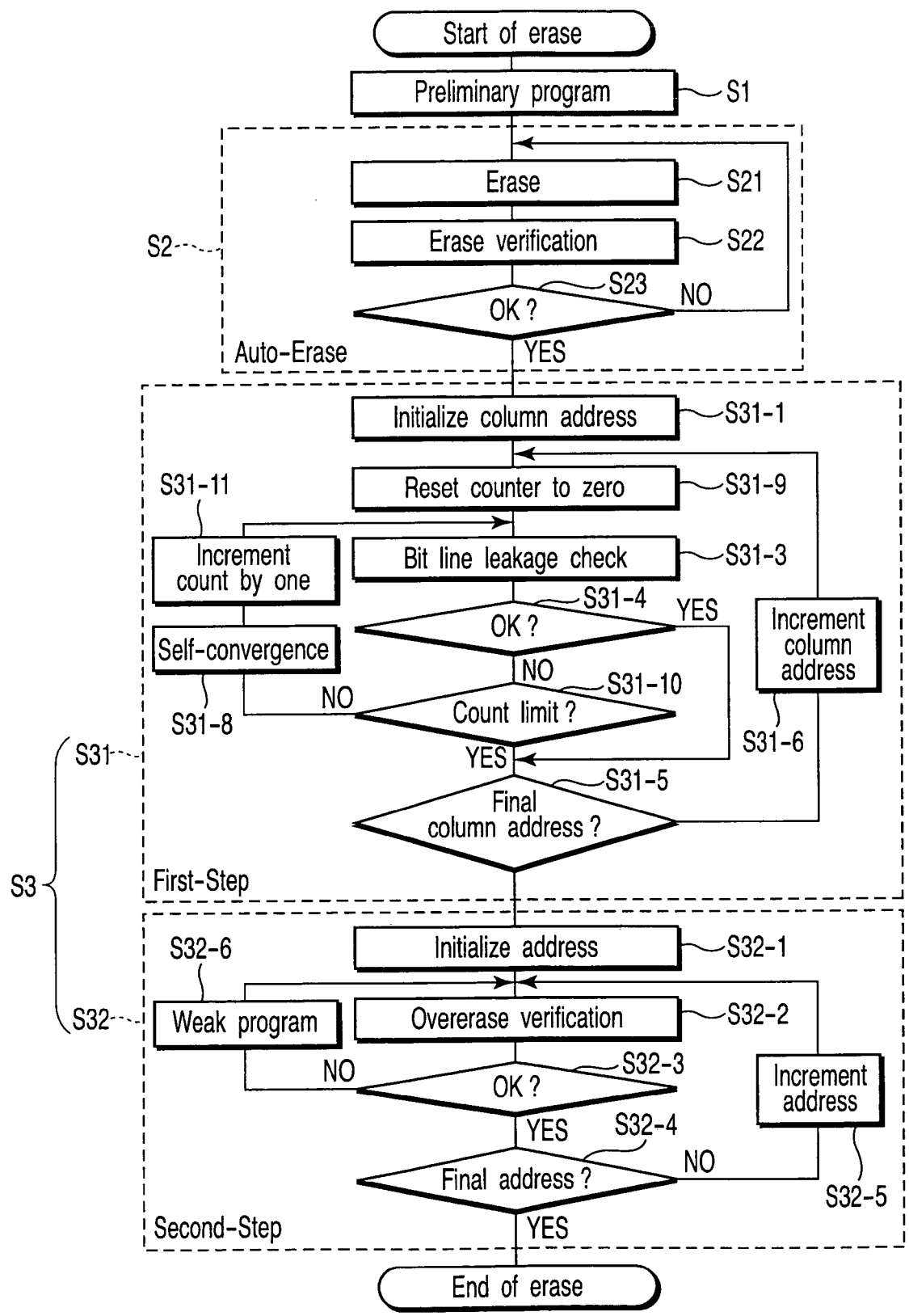
FIG. 19 is a flowchart illustrating a threshold voltage control method of the flash memory according to the second embodiment of the present invention.

Next, a semiconductor storage device and a threshold voltage control method according to a second embodiment of the present invention will be described with reference to FIGS. 18 and 19. FIG. 18 is a block diagram of a NOR type of flash memory according to the second embodiment. FIG. 19 is a flowchart illustrating the threshold voltage control method. With the second embodiment, the self-convergence process is restricted by the number of times rather than by time.

As shown in FIG. 18, the flash memory of the second embodiment differs from the flash memory of the first embodiment shown in FIG. 1 only in that the timer circuit 13 is replaced by a counter circuit 14. The counter circuit 14 counts the number of times the self-convergence process is performed at erase time.

As shown in FIG. 19, in the threshold voltage control method of the second embodiment, the process of time measurement by the timer circuit 13 in the method described in the first embodiment is replaced by a process of counting by the counter circuit 14 of the number of times the self-convergence process is performed.

That is, in the first step (step S31), after initializing the column address (substep S31-1), the control circuit 2 resets the count in the counter circuit 14 to zero (substep S31-9). Next, a bit line leakage check is made (substep S31-3). If the leakage current is of a predetermined magnitude or more (NO in substep S31-4), then the control circuit 2 checks the counter circuit 14 for its count (substep S31-10). If the count is less than a predetermined value (NO in substep S31-10), then self-convergence is carried out (substep S31-8). Upon termination of the self-convergence, the counter circuit 14 increments its count by one. The procedure then returns to substep S31-3.

That is, if the bit line leakage has fallen below a predetermined level or the number of times the self-convergence was performed has exceeded a predetermined value, the control circuit terminates self-convergence process for the corresponding bit line. Suppose, for example, that the number of times the self-convergence is to be performed is ten. Although the self-convergence has been performed ten times, if the bit line leakage remains greater than the predetermined level, the self-convergence is no longer performed on the corresponding bit line. The memory cells connected to the corresponding bit line are remedied by the next weak program.

The subsequent process remains unchanged from that in the first embodiment and hence a description thereof is omitted.

The flash memory according to the second embodiment will also offer the advantages (1) and (2) described in the first embodiment.

Figure 21:
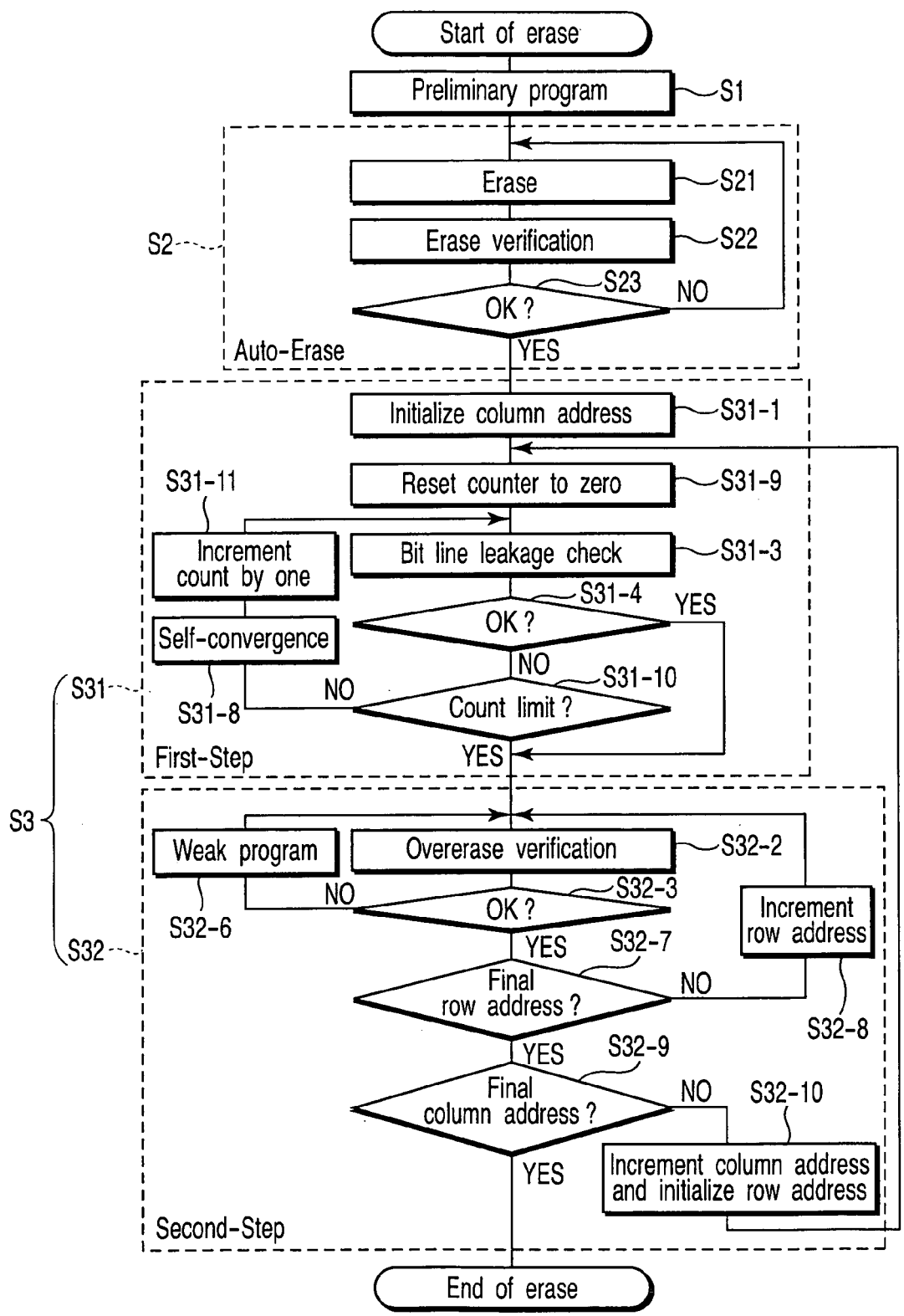
FIG. 21 is a flowchart illustrating a threshold voltage control method according to a modification of the second embodiment of the present invention.

FIGS. 20 and 21 are flowcharts illustrating flash memory threshold voltage control methods according to modifications of the first and second embodiments. In the first and second embodiments, the self-convergence is first performed on all the columns (bit lines) and then the weak program sequence is carried out starting with the first column. The first and second embodiments may be modified such that the self-convergence and the weak program are performed in turn for each column and the column address is finally incremented after the threshold voltages Vth of memory cells have come to exceed the second overerase verification voltage VOEV2.

That is, as shown in FIGS. 20 and 21, if the leakage current flowing in a selected bit line is less than 1 µA (YES in substep S31-4), or the time measured by the timer circuit 13 has passed the predetermined time (YES in substep S31-7), or the number of times that the self-convergence was performed has exceeded a predetermined value (YES in substep S31-10), the procedure goes to substep S32-2 in the second step (step S32) without regard to the column address. Overerase verification is then performed on a selected memory cell.

After the overerase verification, a decision is made as to whether or not the on current caused by the selected memory cell to flow in the bit line is less than 10 µA in substep S32-3.

If the on current is 10 µA or more (NO in substep S32-3), then the procedure goes to substep S32-6 to perform the weak program and then returns to substep S32-2. If, on the other hand, the on current is less than 10 µA (YES in substep S32-3), then the procedure goes to substep S32-7 to make a decision of whether or not the row address is the final one.

If the row address is not the final one, then the procedure goes to substep S32-8 to increment the row address by one and then returns to substep S32-2. If, on the other hand, the row address is the final one, then the procedure goes to substep S32-9 to make a decision of whether the column address is the final one.

If the column address is not the final one, then the procedure goes to substep S32-9 to initialize the row address and increment the column address by one. The procedure then returns to substep S31-2 (FIG. 20) or substep S31-9 (FIG. 21) in the first step to perform a bit line leakage check on the bit line selected by the incremented column address. If the final column address has been reached, the erase operation is completed.

According to these modifications, the number of times the column address is scanned can be reduced from two (substeps S31-5 and S32-5 in FIGS. 3 and 19) in the first and second embodiments to one (substep S32-10 in FIGS. 20 and 21), allowing the erase sequence to be simplified.

The first and second embodiments can be applied, as needed, not only to NOR types of flash memories but also to other types of flash memories which perform similar operations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array in which a plurality of memory cells each having a stacked gate including a floating gate and a control gate is arranged in rows and columns;
a plurality of word lines each of which connects commonly the control gates of the memory cells arranged in a respective one of the rows;
a plurality of bit lines each of which connects commonly drains of the memory cells arranged in a respective one of the columns;
a control circuit which performs first control to collectively shift the threshold voltages of the memory cells to within a predetermined range with a first level as an upper limit, second control to shift a lower limit of the threshold voltages shifted to within the predetermined range through the first control toward a second level lower than the first level, and third control to shift the lower limit of the threshold voltages shifted through the second control to a third level between the first and second levels; and
a measurement circuit which measures the elapsed time from the start of the second control,
the control circuit repeating the second control until the lower limit of the threshold voltages reaches the second level or the elapsed time measured by the measurement circuit reaches a predetermined time, then terminating the second control when the lower limit of the threshold voltages reaches the second level or the elapsed time measured by the measurement circuit reaches the predetermined time and performing the third control.

2. The device according to claim 1, wherein a voltage applied to a selected word line during the third control is higher than a voltage applied to it during the second control.

3. The device according to claim 1, wherein the second control is a self-convergence process to write data into the memory cells connected to a selected bit line at one time.

4. The device according to claim 1, wherein the third control is selectively performed on memory cells the threshold voltages of which are less than the third level.

5. The device according to claim 1, wherein a voltage applied to a selected word line during the third control is lower than a voltage applied to it during an operation of writing data into the memory cells.

6. The device according to claim 1, wherein the second control is performed on each of the memory cells connected to a selected bit line at the same time.

7. The device according to claim 1, wherein the third control is performed individually on each of the memory cells.

8. A semiconductor memory device comprising:
a memory cell array in which a plurality of memory cells each having a stacked gate including a floating gate and a control gate is arranged in rows and columns;
a plurality of word lines each of which connects commonly the control gates of the memory cells arranged in a respective one of the rows;
a plurality of bit lines each of which connects commonly drains of the memory cells arranged in a respective one of the columns;
a control circuit which performs first control to collectively shift the threshold voltages of the memory cells to within a predetermined range with a first level as an upper limit, second control to shift a lower limit of the threshold voltages shifted to within the predetermined range through the first control toward a second level lower than the first level, and third control to shift the lower limit of the threshold voltages shifted through the second control to a third level between the first and second levels; and
a measurement circuit which counts the number of times the second control is performed,
the control circuit repeating the second control until the lower limit of the threshold voltages reaches the second level or the count in the measurement circuit reaches a predetermined value, then terminating the second control when the lower limit of the threshold voltages reaches the second level or the count in the measurement circuit reaches the predetermined time and performing the third control.

9. The device according to claim 8, wherein a voltage applied to a selected word line during the third control is higher than a voltage applied to it during the second control.

10. The device according to claim 8, wherein the second control is a self-convergence process to write data into the memory cells connected to a selected bit line at one time.

11. The device according to claim 8, wherein the third control is selectively performed on memory cells the threshold voltages of which are less than the third level.

12. The device according to claim 8, wherein a voltage applied to a selected word line during the third control is lower than a voltage applied to it during an operation of writing data into the memory cells.

13. The device according to claim 8, wherein the second control is performed on each of the memory cells connected to a selected bit line at the same time.

14. The device according to claim 8, wherein the third control is performed individually on each of the memory cells.

15. A method of controlling a threshold voltage of a semiconductor memory device having memory cells each including a stacked gate containing a floating gate and a control gate, comprising:
collectively shifting the threshold voltage of the memory cells to within a predetermined range with a first level as its upper limit;
starting time measurement;
shifting the lower limit of the threshold voltages collectively shifted to within the predetermined range toward a second level lower than the first level;
repeating shifting the lower limit of the threshold voltages toward the second level until the lower limit of the threshold voltages reaches the second level or the elapsed time form the start of time measurement reaches a predetermined time; and
shifting the lower limit of the threshold voltages to a third level between the first and second levels when the lower limit of the threshold voltages reaches the second level or the elapsed time from the start of time measurement reaches a predetermined time.

16. The method according to claim 15, wherein a voltage applied to the control gates of memory cells in shifting the lower limit of the threshold voltages toward the second level is less than a voltage applied thereto in shifting the lower limit of the threshold voltages to the third level.

17. A method of controlling a threshold voltage of a semiconductor memory device having memory cells each including a stacked gate containing a floating gate and a control gate, comprising:
collectively shifting the threshold voltage of the memory cells to within a predetermined range with a first level as its upper limit;
shifting the lower limit of the threshold voltages collectively shifted to within the predetermined range toward a second level lower than the first level;
counting the number of times of shifting the lower limit of the threshold voltages toward the second level is performed;
repeating shifting the lower limit of the threshold voltages toward the second level until the lower limit of the threshold voltages reaches the second level or the count reaches a predetermined number; and
shifting the lower limit of the threshold voltages to a third level between the first and second levels when the lower limit of the threshold voltages reaches the second level or the count reaches the predetermined number.

18. The method according to claim 17, wherein a voltage applied to the control gates of memory cells in shifting the lower limit of the threshold voltages toward the second level is less than a voltage applied thereto in shifting the lower limit of the threshold voltages to the third level.

* * * * *